United States Patent [19]

Charles et al.

[11] Patent Number: 4,971,944
[45] Date of Patent: Nov. 20, 1990

[54] METHOD OF ELECTROLESS DEPOSITING OF GOLD ONTO SUPERCONDUCTING PARTICLES

[75] Inventors: Robert G. Charles, Hampton Township, Allegheny County; Graham A. Whitlow, Murrysville, both of Pa.

[73] Assignee: Westinghouse Electric Corp., Pittsburgh, Pa.

[21] Appl. No.: 313,125

[22] Filed: Feb. 21, 1989

[51] Int. Cl.$^5$ .......................... B05D 5/12; B05D 1/18
[52] U.S. Cl. ..................................... 505/1; 505/739; 505/785; 427/62; 427/125; 427/217; 427/304; 427/443.1
[58] Field of Search ................ 106/1.26; 427/62, 304, 427/443.1, 217, 125; 505/1, 739, 785

[56] References Cited

U.S. PATENT DOCUMENTS

| | | | |
|---|---|---|---|
| 2,865,376 | 12/1958 | Pellier et al. | 106/1.26 |
| 3,300,328 | 1/1967 | Luce | 106/1.26 |
| 3,589,916 | 6/1971 | McCormack | 106/1.26 |
| 4,005,229 | 1/1977 | Miller et al. | 106/1.26 |
| 4,009,297 | 2/1977 | Redmond et al. | 427/304 |
| 4,374,876 | 2/1983 | El-Shazly et al. | 427/443.1 |

OTHER PUBLICATIONS

Streitz et al, Appl. Phys. Lett. 52(11), 14 Mar. 88, pp. 927–929.

*Primary Examiner*—Norman Morgenstern
*Assistant Examiner*—Margaret Bueker
*Attorney, Agent, or Firm*—Daniel P. Cillo

[57] ABSTRACT

A method of electroless deposition of gold from a solution onto ceramic oxide superconducting particles is characterized by the steps: (1) adding gold chloride to organic solvent-optional reducing agent for the gold chloride to provide a gold solution, (2) mixing the ceramic oxide superconducting particles with the gold solution, to provide a suspension, (3) optionally adding reducing agent for the gold chloride, (4) stirring and heating the suspension to deposit a layer of gold metal on the particles, and (5) separating the particles.

14 Claims, 1 Drawing Sheet

METHOD OF ELECTROLESS DEPOSITING OF GOLD ONTO SUPERCONDUCTING PARTICLES

BACKGROUND OF THE INVENTION

This invention relates to electroless deposition of gold onto ceramic oxide superconductor particles comprising yttrium, rare earth, bismuth, or thallium-alkaline earth metal-copper oxides, and encapsulation of such gold coated ceramic oxide particles between metal sheets or ribbons or in a metal tube, where the gold deposit prevents deleterious reactions at the particle surfaces during and subsequent to fabrication into superconducting tape or wire.

Superconducting materials have been known since 1911, but even modern niobium or vanadium alloys require extremely expensive cooling with liquid helium, which boils at 4° K., in order to operate in the superconducting mode. U.S. Pat. Nos. 4,411,959 and 4,575,927 (Braginski et al.) and 4,050,147 (Winter et al.), teach submicrometer, particulate niobium or vanadium compounds for use in fabricating superconducting wires. Braginski et al. utilize essentially contiguous, submicrometer, superconducting particles, with optional addition of up to 10 volume percent lubricant particles selected from C, $MoS_2$, Cu, Sn, and Ag. Winter et al. mixes superconducting particles with an equal or greater volume of particles of non-superconducting metals, selected from Cu, Ag, Au, or Al, to provide a major metal component matrix around the superconducting particles. All of the non-superconducting particles are smaller than 500 Angstroms approximate diameter, i.e., 0.05 micrometer, and so the distance between the Nb or V containing particles is short.

Perovskite related ceramic oxides, comprising yttrium-alkaline earth metal-copper oxide, such as orthorhombic, yttrium-barium-copper oxide materials, usually characterized as $YBa_2Cu_3O_{7-x}$ or "1:2:3 ceramic oxides", are well-known "high temperature" superconductor materials. This 1:2:3 ceramic oxide material has been found to provide electrical superconductivity, i.e., essentially no electrical resistance, in the region of 93° K. and below.

The 1:2:3 ceramic oxides and other alkaline earth metal-copper oxide based ceramics can operate in the superconducting mode well above the 77° K. boiling point of relatively inexpensive and plentiful liquid nitrogen, and could find increased use in thin film, high speed switching devices, such as Josephson junctions, high current magnets, energy storage coils, long distance power transmission, and the like. At 93° K., electrons in the 1:2:3 ceramic oxides are thought to travel through the layered crystal lattice as Cooper pairs, rather than individually, with few collisions with the lattice atoms. The Cooper pairs can also tunnel through certain non-superconducting metals disposed between superconducting particles, provided the tunneling distance is short.

These 1:2:3 ceramic oxide superconductors are heat sensitive, losing oxygen from the crystal lattice at temperatures over approximately 700° C., in an orthorhombic-to-tetragonal transition. This can cause problems during wire and ribbon fabrication at temperatures greater than ambient. The 1:2:3 ceramic oxides are very reactive with water, and reactive at moderate temperatures with most metals including Pt and Pd. The 1:2:3 ceramic oxides and rare earth-alkaline earth metal-copper oxide based ceramics are also very brittle and incapable of being formed into wire or windings by conventional methods such as drawing or extrusion.

In another area, non-aqueous electroless deposition of metals from Groups VIII, IB, IVB, VB, VIB, VIIB, and IIIA of the Periodic Chart, onto, for example, porous or non-porous catalytic surfaced powders or granules having diameters up to 0.63 cm., such as Pt coated alumina, is taught in U.S. Pat. No. 3,635,761 (Haag et al.) In this deposition method, a metal pi-complex is reduced. In the complex, the central metal atom is bonded to at least one ligand in the form of an organic group containing at least one carbon-to-carbon multiple bond, and, preferably, at least one singly charged ligand, such as a halide ion, is present. An example of the complex would be 1, 5-cyclo octadiene gold (III) trichloride. Reducing agents are used for decomposing the complex. The metal pi-complex is heated in the presence of the reducing agent, solvent, and catalytic surfaced powder, granule or other substrate, thus depositing free metal. This process, however, involves very complicated metal pi-complex starting materials.

In a method of removing surface oxidation from submicron niobium superconducting particles, such as NbC, $Nb_3Al$, NbCN and $Nb_3Sn$, U.S. Pat. No. 4,748,737 (Charles et al.), teaches removing niobium oxide from the particles using aqueous alkali metal hydroxide, temporarily protecting the cleaned particles in aqueous hydrazine, and electroless coating of the particles with copper, silver, tin, gold, platinum or the like in a bath of aqueous solution; or by removing oxide and protecting by alkali metal contact, and reduction of a salt of the desired metal in molten alkali metal. As a final step, the coated particles are annealed in hydrogen.

What is needed, is a simple method to prevent loss of oxygen from superconducting ceramic oxide particles comprising alkaline earth metal-copper oxides during heat treatment or wire or ribbon fabrication, and to still allow close contact of the particles in wire or ribbon form, without contacting water-reactive particles with water, which has been found to deteriorate the electrical properties of some alkaline earth metal-copper oxide based ceramic oxides. It is the main object of this invention to provide such a simple method.

SUMMARY OF THE INVENTION

Accordingly, the invention resides in a method of electroless deposition of gold from a solution onto ceramic oxide particles comprising alkaline earth metal-copper oxide, characterized by the steps: (1) adding gold chloride to at least one organic compound that is effective to act as solvent and optional reducing agent for the gold chloride, in a liquid environment non-reactive to subsequently added ceramic oxide particles, to provide a gold solution, (2) mixing ceramic oxide particles comprising alkaline earth metal-copper oxide having superconducting properties with the gold solution, to provide a suspension of the ceramic oxide particles in the gold solution, (3) optionally adding an organic compound that is effective to act as a reducing agent for gold chloride, (4) heating the suspension so that a layer of gold metal, from approximately 2 Angstroms to 1,000 Angstroms thick, deposits on the ceramic oxide particles, (5) separating the gold coated ceramic oxide particles, and (6) removing organic from the gold coated ceramic oxide particles. As a last step, the gold coated ceramic oxide particles can be pressed into a structure such as a pellet, disc or foil sheet. A plurality of such dense structures can be encapsulated between metal sheets or within a metal tube. The term "compound that is effective to act as solvent and optional reducing agent" is used herein to mean that such compound is always a solvent, and in many cases also functions as a reducing agent for gold chloride. The term oxide particles "comprising" alkaline earth metal-copper oxide, is here meant that other elements can also be present, including for example the materials: yttrium-alkaline earth metal-copper oxide; rare earth-alkaline earth metal-copper oxide, where rare earth includes elements from 57 to 71, with La, Ho, Er, and Yb preferred; bismuth-alkaline earth metal-copper oxide; and thallium-alkaline earth metal-copper oxide; and their mixtures. Alkaline earth metals include Mg, Ca, Sr, Ba, and their mixtures. The ceramic oxide particles most useful in this method are the $YBa_2Cu_3O_{7-x}$ ceramics. When they are used, the gold chloride must be dissolved in a non-aqueous, liquid environment. In the above method, if optional step (3) is used, the suspension of ceramic oxide in the gold solution can also be heated prior to step (3).

BRIEF DESCRIPTION OF THE DRAWINGS

In order that the invention will be more readily understood, the following description of preferred embodiments will now be described, by way of example only, with reference to the accompanying drawings, in which.

DESCRIPTION OF THE PREFERRED EMBODIMENTS

The ceramic oxide particles which are useful in the gold coating method of this invention comprise alkaline earth metal-copper oxides selected from the group consisting of yttrium-containing, alkaline earth metal-copper oxides, such as $YBa_2Cu_3O_{7-x}$ ceramics; rare earth metal-containing, alkaline earth metal-copper oxides, such as $LaBa_2Cu_3O_{7-x}$ ceramics; and bismuth containing, alkaline earth metal-copper oxides or thallium containing, alkaline earth metal-copper oxides, such as (Bi or Tl)(Ba or Sr)$_2$Ca$_{n-1}$Cu$_n$O$_z$ ceramics, as described by P. Haldar et al., in *Science*, Vol. 241, September 1988, pp. 1198–1200. The most preferred materials are the 1:2:3 ceramic oxides, usually characterized as $YBa_2Cu_3O_{7-x}$. The alkaline earth metal-copper oxide based ceramic will be chemically formed from appropriate amounts of constituent oxides and treated by heat or the like to provide optimized superconducting properties, as is well known in the art. Their approximate diameter will be less than 1 micrometer (10,000 Angstroms) preferably less than 1,000 Angstroms.

Figure 1:
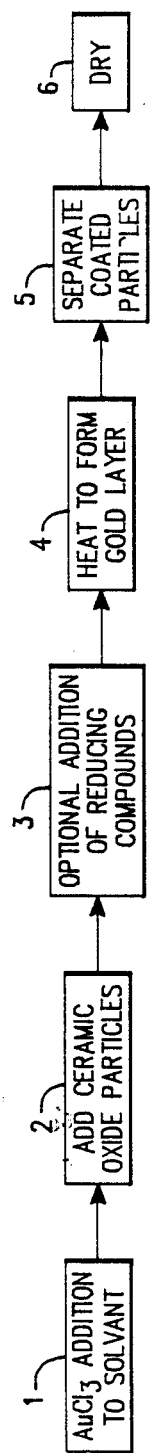
FIG. 1, which best illustrates the invention, is a block diagram which sets forth the steps of gold coating superconducting ceramics, in accordance with the teachings of this invention.

FIG. 1 shows the method of this invention in block diagram form. In step 1, gold chloride is added to at least one organic component acting as solvent and possibly also as a reducing agent for the gold chloride, in a liquid environment non-reactive to the subsequently added ceramic oxide particles, to provide a gold solution. In instances where bismuth or thallium-containing, alkaline earth-copper oxide ceramic particles are used, water may be tolerated in the liquid. In step 2, the ceramic oxide particles are added to the gold solution, to provide a suspension of the ceramic oxide particles. When yttrium-containing, 1:2:3 ceramic oxides are used, the gold chloride must be dissolved in a non-aqueous environment and the gold chloride should be anhydrous i.e., $AuCl_3$, rather than $AuCl_3.2H_2O$.

Preferred organic compounds acting as solvent and optional reducing compounds, utilized in step (1) of the invention, are selected from the group consisting of: (1) substituted aromatic compounds added as a liquid or as a low melting (m.p. below 60° C.) compound, such as: amino ($NH_2$) substituted benzene compounds, for example aniline; halogen substituted benzene compounds, for example chlorobenzene, fluorobenzene, bromobenzene, and the like; hydrocarbon substituted benzene having a total of up to 12 carbon atoms as additions to the benzene ring; for example, propylbenzene, methylethylbenzene, and the like; monohydroxyl substituted benzene, for example phenol (m.p. 41° C.); and nitro ($NO_2$) substituted benzene, for example, nitrobenzene, (2) aliphatic alcohols having up to 8 carbon atoms, for example, methyl alcohol, ethyl alcohol, butyl alcohol, and the like; (3) carbocyclic alcohols, for example, cyclohexanol, benzyl alcohol, and the like; (4) organic ethers containing up to a total of 12 carbon atoms, for example, diethylether, methyl ethyl ether, dipropyl ether, and the like; and mixtures of all these groups. The preferred compounds are at least one of nitrobenzene, ethyl alcohol, and diethyl ether. All of these compounds will be effective to dissolve gold chloride, and, many if not most of them act in a dual role, also being effective to reduce gold chloride. These same organic compounds can be used as a medium to suspend the ceramic oxide particles prior to addition to the gold solution. If the ceramic oxide particles are already in suspension, mixing with the gold solution is easier.

It is necessary to reduce the gold chloride to Au in the method of this invention, so, if the initial addition compounds acting as solvent and optional reducing agent will not be effective in completely reducing gold chloride, or if for any reason additional reducing compound for gold chloride is required, optional step (3) can be included in the method of this invention, wherein selected organic reducing compounds or agents can be added.

The preferred organic reducing compounds are selected from the group consisting of: (1) poly-hydroxyl substituted benzene, for example, hydroquinone $C_6H_4(OH)_2$, pyrogallol $C_6H_3(OH)_3$, and the like, (2) naphthohydroquinone, and (3) ascorbic acid ($OCO$-$COH$:$COHCHCHOHCH_2$). These materials are usually in solid form, and must be dissolvable in the suspension of ceramic oxide particles, or first dissolved prior to addition. In the most preferred embodiment of the invention, the gold chloride will be dissolved and partially reduced by addition of at least one of nitrobenzene methyl alcohol, ethyl alcohol or diethyl ether in step (1) and then completely reduced by dissolving one of either hydroquinone or L-ascorbic acid into the suspension admixture in step (3) to insure complete reduction of $AuCl_3$ to $Au°$.

In step 4, the ceramic particle suspension is heated at a temperature effective to form a layer of gold on the particles, preferably from approximately 30° C. to 100° C., preferably with stirring. As an example of gold deposition, the reduction of auric chloride in the presence of an alcohol can be represented by the following chemical reaction: $AuCl_3 + ROH \rightarrow Au +$ oxidized and chlorinated organics When an alcohol is employed, the organic byproducts are likely to be aldehydes or ketones. The fate of the chlorine content of $AuCl_3$ is less certain, but it is most likely incorporated into the organic reaction products. It appears improbable that the chlorine would be bound by the 1:2:3 ceramic oxide particles in view of the mild reaction conditions required for plating.

While reduction of $AuCl_3$ to gold metal in the presence of an organic liquid occurs slowly at room temperature, it should be possible to control the rate of deposition to any required degree by raising or cooling the reaction temperature and/or by choosing the appropriate alcohol, ether solvent, or other solvent. In addition, one can increase the available temperature region of reaction by choosing a higher boiling alcohol (e.g., butyl alcohol) instead of a lower boiling one (ethyl alcohol). It should be noted also that the initial solubility of $AuCl_3$ should be a function of the solvent chosen.

A typical metal coating operation for 1:2:3 ceramic oxides would consist of the following steps: anhydrous auric chloride would be dissolved at room temperature in the chosen alcohol, ether, or the like, to give a somewhat less than saturated gold solution. This solution would then be mixed with powdered 1:2:3 ceramic oxide or other superconducting ceramic particles in the proper amount to give the desired thickness of deposited gold. The ceramic oxide would usually first be added to the same medium used to dissolve the auric chloride, so that the ceramic oxide is in a suspension form at the time of mixing with the gold solution. The suspension of powdered 1:2:3 ceramic oxide compound in the dissolved $AuCl_3$ solution would be rapidly stirred and the temperature of the mixture gradually raised until a suitable reduction rate would be achieved.

A crude, but effective, method of monitoring the rate of the reaction should be possible by observing the loss of color from the supernatant liquid when stirring is stopped at intervals. After the reduction is complete, the suspended, gold plated particulate product is isolated by filtering off on a fine porosity membrane filter or by the use of a centrifuge. The product is washed with a volatile alcohol or ether to remove high-boiling solvents (if present) and to remove organic oxidized and/or chlorinated byproducts. Finally, the product would be dried in a vacuum or in a dry nonreacting gas stream.

The success of the above described procedure will be dependent on a preferential deposition of gold on the 1:2:3 ceramic oxide particulates, as opposed to deposition on the container. In view of the very large total surface area of the particulates, preferential deposition here seems likely. In addition, the 1:2:3 ceramic oxide particles could have a catalytic effect resulting in increased gold deposition rate. In addition to the advantages of gold plating 1:2:3 ceramic oxide particles, an added advantage may be found in the thermal conductivity, during operation of a superconducting wire containing such gold coated oxides of directing heat away from the 1:2:3 superconducting particles to the external metal sheath.

In step 5, the gold coated ceramic oxide particles are separated from the liquid by any effective means, such as use of a centrifuge, or if the particles are large enough, by simple filtration. In step 6, the gold coated ceramic oxide particles are dried, preferably from approximately 30° C. to 50° C., although room temperature drying can also be used, to remove organic constituents.

The initial coating of gold on the superconducting ceramic oxides will preferably be from approximately 2 Angstroms to 1,000 Angstroms thick, most preferably from 2 Angstroms to 100 Angstroms. The coating of gold will be less than 30 Angstroms, preferably less than 10 Angstroms thick after the coated particles are pressed into a structure. Subsequent to this step, the pressed, coated particles can be encapsulated between metal sheets or ribbons or within a metal tube, to make a superconducting foil or filament. Such coated particles can also be used in other ways to provide superconducting films and the like.

This thin gold coating is oxygen and water vapor impermeable. The coating will prevent loss of surface superconductivity due to any possible reaction of the ceramic oxide with other metals, oxygen, or water vapor. The gold coating will also prevent loss of superconductivity due to any possible loss of oxygen from the crystal lattice of the ceramic oxide during any subsequent heat treatment required to fabricate ribbon, tape or wire, since the diffusion rate of oxygen through gold is very low at most processing temperatures. The gold coating will constitute only from 5 vol. % to 40 vol. % of the gold coated ceramic particle volume and is thin enough to easily allow Cooper pair electron tunneling between adjacent, pressed, superconducting ceramic oxide particles.

Figure 2:
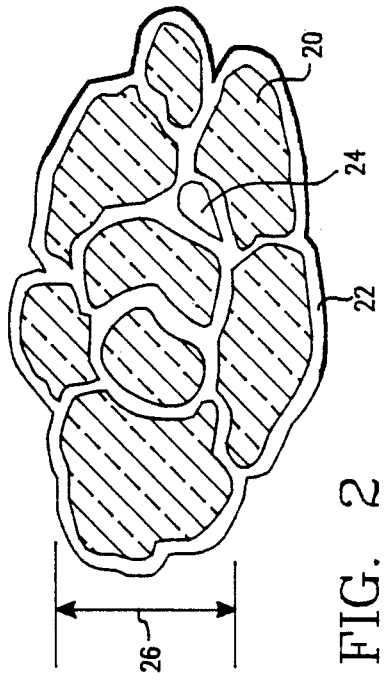
FIG. 2, shows an idealized cross sectional view of the coated, pressed ceramic made by the method of this invention.

The pressed particles are, in the main, separated rather than contiguous, and the ceramic oxide forms a matrix for the gold, as shown in FIG. 2, where the superconducting particles are shown as 20 and the gold coating is shown as 22. A very few voids 24 may also be present. The approximate diameter of the particles, defined here as the "diameter", will approach the average diameter of the particles, for example distance 26. By completely coating all the ceramic oxide particles, the pressed ceramic becomes somewhat ductile and flowable, allowing ease of bending and drawing when placed between appropriate metal sheets or ribbons or placed within an appropriate metal sheath. This coating also eliminates the need for coating metal sheet or sheaths with barrier layer coatings. The gold coating also promotes good electrical contact between ceramic oxide particles and between the ceramic oxide particles and the encapsulating metal used to fabricate a tape or wire form.

The invention will now be illustrated with reference to the following Example.

EXAMPLE

Two grams of powdered, preformed $YBaCuO_{7-x}$ (1:2:3 ceramic oxide), of particle diameter less than 1 micrometer, were suspended in 100 ml of absolute ethyl alcohol by rapid magnetic stirring. One tenth of a gram of solid $AuCl_3$ was dissolved as quickly as possible in 10 ml of absolute ethyl alcohol to provide a gold solution. The resulting gold solution was added immediately to the stirred oxide suspension. The $AuCl_3$ solution was used quickly so that the solid reduction product of $AuCl_3$ would not separate from solution before any interaction with the oxide particles occurred.

The mixture was stirred briefly with the temperature raised to about 60° C.. Then, two grams of the reducing agent L-ascorbic acid was added, as the solid, to insure complete reduction of $AuCl_3$. After a few minutes more of stirring, the mixture was cooled to room temperature. No gold deposit was observed on the walls of the reaction vessel. Solid black, ceramic particulate matter was filtered off on a sintered glass crucible, washed separately with anhydrous ethyl alcohol, and finally dried in a vacuum desiccator for at least 16 hours. A fine gold plating was observed on the ceramic particles.

We claim:

1. A method of electroless deposition of gold from a solution onto ceramic oxide particles, comprising alkaline earth metal-copper oxide, comprising the steps:

(1) adding gold chloride to at least one organic compound that is effective to act as solvent and optional reducing agent for the gold chloride, in a nonaqueous liquid environment non-reactive to subsequently added ceramic oxide particles, to provide a gold solution, (2) mixing ceramic oxide particles comprising alkaline earth metal-copper oxide having superconducting properties with the gold solution, to provide a suspension of the ceramic oxide particles in the gold solution, (3) optionally adding an organic compound that is effective to act as a reducing agent for gold chloride, (4) heating the suspension so that a layer of gold metal, from approximately 2 Angstroms to 1,000 Angstroms thick, deposits on the ceramic oxide particles, (5) separating the gold coated ceramic oxide particles, and (6) removing organic constituents from the gold coated ceramic oxide particles;

where, if the organic compound added in step (1) does not act as a reducing agent, an organic compound reducing agent is added in step (3).

2. The method of claim 1 where the gold chloride is anhydrous.

3. The method of claim 1 where the alkaline earth metal-copper oxide is selected from the group consisting of yttrium-alkaline earth metal-copper oxide; rare earth metal-alkaline earth metal-copper oxide; bismuth-alkaline earth metal-copper oxide; and thallium-alkaline earth metal-copper oxide.

4. The method of claim 1 where the alkaline earth metal-copper oxide is $YBa_2Cu_3O_{7-x}$.

5. The method of claim 1 where the organic compound that is effective to act as solvent and optional reducing agent used in step (1) is selected from the group consisting of amino substituted benzene, halogen substituted benzene, hydrocarbon substituted benzene having a total of up to 12 carbon atoms as additions to the benzene ring, mono-hydroxyl substituted benzene, nitro substituted benzene, aliphatic alcohols having up to 8 carbon atoms, organic ethers containing up to a total of 12 carbon atoms; and mixtures thereof.

6. The method of claim 1 where the organic compound that is effective to act as a reducing agent for gold chloride which may be added in optional step (3) is selected from the group consisting of poly-hydroxyl substituted benzene, naphthohydroquinone, ascorbic acid, and mixtures thereof.

7. The method of claim 1 where the ceramic particles have diameters up to 10,000 Angstroms.

8. The method of claim 1 where the ceramic particles have diameters up to 1,000 Angstroms and the layer of gold metal deposited in step (4) is from 2 Angstroms to 100 Angstroms thick.

9. The method of claim 1 where organic compound is added in step (3) and the suspension is stirred and heated from approximately 30° C. to 100° C. in step (4).

10. The method of claim 1 where organic compound is added in step (3) and the suspension is heated prior to step (3).

11. The method of claim 1 where as a last step, the gold coated ceramic oxide particles are pressed into a structure.

12. The method of claim 5 where the ceramic oxide particles are suspended in the organic compound used in step (1) prior to mixing with the gold solution.

13. A method of electroless deposition of gold from a solution onto ceramic oxide particles, comprising alkaline earth metal-copper oxides, comprising the steps:

(1) adding gold chloride to at least one organic compound selected from the group consisting of nitrobenzene, methyl alcohol, ethyl alcohol, diethylether, and mixtures thereof, to provide a gold solution, (2) mixing ceramic oxide particles comprising alkaline earth metal-copper oxide having superconducting properties with the gold solution, to provide a suspension of the ceramic oxide particles in the gold solution, (3) mixing a reducing agent selected from the group consisting of hydroquinone, ascorbic acid, and mixtures thereof with the suspension of step (2) and stirring and heating the suspension admixture so that a layer of gold metal, from approximately 2 Angstroms to 1,000 Angstroms thick, deposits on the ceramic oxide particles, and (4) separating the gold coated ceramic oxide particles.

14. The method of claim 13 where the alkaline earth metal-copper oxide is selected from the group consisting of yttrium-alkaline earth metal-copper oxide; rare earth metal-alkaline earth metal-copper oxide; bismuth-alkaline earth metal-copper oxide; and thallium-alkaline earth metal-copper oxide.

* * * * *